United States Patent
Tsao et al.

(10) Patent No.: US 7,112,522 B1
(45) Date of Patent: Sep. 26, 2006

(54) METHOD TO INCREASE BUMP HEIGHT AND ACHIEVE ROBUST BUMP STRUCTURE

(75) Inventors: Pei-Haw Tsao, Taichung (TW); Clinton Chao, Hsinchu (TW); Chung-Yu Wang, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 11/268,514

(22) Filed: Nov. 8, 2005

(51) Int. Cl.
*H01L 21/44* (2006.01)

(52) U.S. Cl. ............... 438/612; 257/779; 257/E23.023; 257/E21.508

(58) Field of Classification Search ................ 438/612; 257/779, E23.023, E21.508
See application file for complete search history.

(56) References Cited

U.S. PATENT DOCUMENTS

| | | | |
|---|---|---|---|
| 6,828,677 B1 * | 12/2004 | Yap et al. .................. | 257/737 |
| 2004/0005771 A1 * | 1/2004 | Fan et al. .................. | 438/613 |
| 2005/0164483 A1 * | 7/2005 | Jeong et al. ................ | 438/612 |
| 2006/0017171 A1 * | 1/2006 | Weng ......................... | 257/766 |
| 2006/0076677 A1 * | 4/2006 | Daubenspeck et al. ..... | 257/734 |

* cited by examiner

*Primary Examiner*—Matthew Smith
*Assistant Examiner*—Nicholas J. Tobergte
(74) *Attorney, Agent, or Firm*—Birch, Stewart, Kolasch & Birch, LLP

(57) ABSTRACT

Methods for forming solder bumps on a semiconductor device are provided. In one embodiment, a substrate is provided having at least one contact pad formed thereon. A passivation layer is formed overlying the substrate, the passivation layer having at least one opening therein exposing a portion of the contact pad. A UBM (Under Bump Metallurgy) layer is formed overlying the passivation layer and the contact pad. A patterned and etched light sensitive layer is provided overlying the UBM layer, the light sensitive layer defining at least one opening therein. A sidewall bump layer is formed over the exposed surfaces of the light sensitive layer and the UBM layer. A portion of the sidewall bump layer above the light sensitive layer is removed. A solder material is deposited in the opening bordered by the etched sidewall bump layer to form a solder column. The solder column is then reflown to create a solder bump.

15 Claims, 5 Drawing Sheets

METHOD TO INCREASE BUMP HEIGHT AND ACHIEVE ROBUST BUMP STRUCTURE

BACKGROUND

The present invention relates generally to the formation of solder bumps on an integrated circuit device, and more particularly, to the formation of solder bumps having improved height and reliability.

Faster, reliable, and higher-density circuits at lower costs are the goals for integrated circuit (IC) packaging. Conventional wirebond technology, the most common method for electrically connecting aluminum bonding pads on a chip surface to the package inner lead terminals on the lead-frame or substrate has proven to be low cost and reliable. But for the future, packaging goals will be met by increasing the density of chips and reducing the number of internal interconnections. Packages with fewer interconnecting links lower potential failure points, reduce the circuit resistance, and reduce interconnect capacitance, which affects electrical performance. The need to reduce the IC package to fit end-user applications (e.g., smart cards, palmtop computers, camcorders, and so on) is driving the new packaging designs that reduce size and overall profile. This reduction is offset by the need for handling larger amounts of parallel data lines, therefore driving the need to increase package input/output requirements with more leads.

Advanced packaging designs are regularly introduced to solve packaging challenges. One such advanced package design is flip chip. Flip chip is a packaging method of mounting the active side of a chip (with the surface bonding pads) toward the substrate (i.e., upside down placement of the bumped die relative to the wirebonding approach—thus the reason for the term "flip" chip). It provides the shortest path from the chip devices to the substrate and low cost interconnection for high I/O counts and high volume automated production. There is also a reduction in weight and profile since leadframes or plastic packages are often not used. Flip chip technology uses solder bumps—usually formed from tin/lead solder in a 5% Sn and 95% Pb ratio—to interconnect the chip bonding pads to the substrate.

There are several methods known to those skilled in the art for producing solder bumps on a semiconductor device. FIGS. 1A–1E illustrate a prior art method of forming a bump on a substrate of a semiconductor wafer. As shown in FIG. 1A, a semiconductor wafer 10 is provided having a base silicon substrate 12 with metal interconnect layers (not shown) overlying substrate 12 and an upper passivation layer 14, which may be one or more layers, that extends partially over a bond pad or contact pad 15 located on the upper surface of the semiconductor wafer 10. Passivation layer 14 has an opening overlying contact pad 15 so that electrical contact to an external circuit may be made from the semiconductor wafer 10. Contact pad 15 may be made from any of a variety of metals, such as aluminum, aluminum alloys, copper, and copper alloys. Typically, a under bump metallurgy (UBM) layer 16 is provided over the entire upper surface of semiconductor wafer 10 and over the upper surface of contact pad 15. UBM layer 16 may be composed of a plurality of individual layers of a variety of different metals and may be deposited by any of a variety of methods including electroless plating, sputtering, or electroplating. As shown in FIG. 1B, thereafter, a photoresist layer 22 is thereafter deposited over UBM layer 16 and patterned to provide an opening 24 overlying contact pad 15 on semiconductor wafer 10. Thereafter, an extra UBM layer 26 may be deposited by conventional methods such as electroplating over UBM layer 16. An electrically conductive material (e.g. solder) may then be deposited in opening 24 and on top of extra UBM layer 26 as shown in FIG. 1C to form a column of solder material 30. As shown in FIG. 1D, after the removal of the photoresist layer 22, the UBM layer 16 is etched through by a reactive ion etch (RIE) process, for example, to the underlying passivation layer 14 using the solder column 30 as an etching mask. The solder column 30 is then heated to reflow to form a solder bump 32 over semiconductor wafer 10 as shown in FIG. 1E.

Part of the standard process for forming a solder bump is the reflow step where the solder column 30 is gently heated to ensure its adhesion to the underlying UBM layer 16. As a result of this, the solder column 30 assumes a spherical shape (due to surface tension forces) and the solder column 30 becomes a solder bump 32, as illustrated in FIG. 1E. This leads to the diameter of the solder bump 32 being larger than the width of the base UBM layer 16. Furthermore, this creates a sharp angle between solder bump 32 and underlying UBM layer 16. The large solder bump diameter becomes a disadvantage in the manufacture of fine pitch bumping due to the concerns of solder bump bridging leading to short circuit in the integrated circuit. The trend in the semiconductor industry is to reduce the pitch of the solder bump arrays in order to accommodate higher level of circuit integration in integrated circuit devices that require greater interconnection densities. The sharp angle degrades the solder bump joint integrity and reliability and consequently, more bump protection is needed in flip chip packaging.

For these reasons and other reasons that will become apparent upon reading the following detailed description, there is a need for an improved method for forming solder bumps and solder bump structures that do not have the drawbacks or shortcomings of the conventional methods for forming solder bumps or solder bump structures.

SUMMARY

The present invention is directed to methods for forming solder bumps on a semiconductor device. In one embodiment, a substrate is provided having at least one contact pad formed thereon. A passivation layer is formed overlying the substrate, the passivation layer having at least one opening therein exposing a portion of the contact pad. A UBM (Under Bump Metallurgy) layer is formed overlying the passivation layer and the contact pad. A patterned and etched light sensitive layer is provided overlying the UBM layer, the light sensitive layer defining at least one opening therein. A sidewall bump layer is formed over the exposed surfaces of the light sensitive layer and the UBM layer. A portion of the sidewall bump layer above the light sensitive layer is removed. A solder material is deposited in the opening bordered by the etched sidewall bump layer to form a solder column. The solder column is then reflown to create a solder bump.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present invention, and in which.

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1A:
FIGS. 1A–1E are cross-sectional views of a semiconductor device depicting a prior art method of forming a solder bump structure.
Figure 1B:
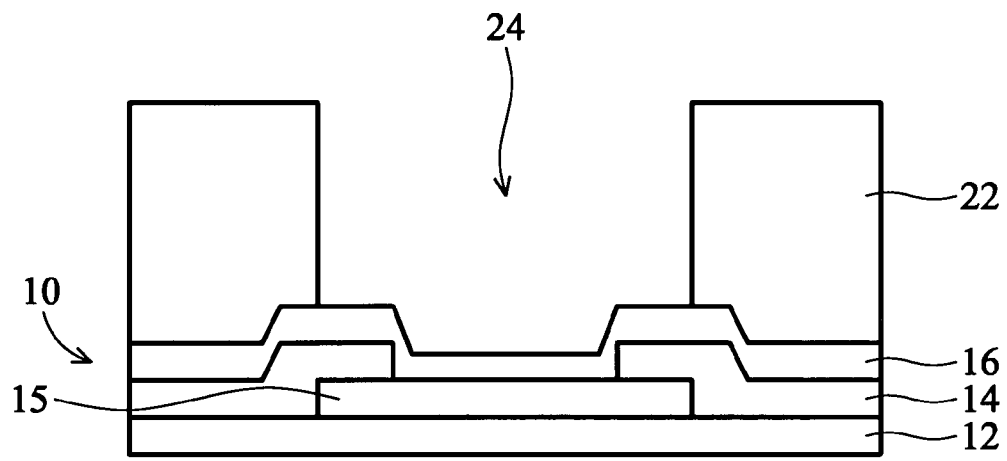
Figure 1C:
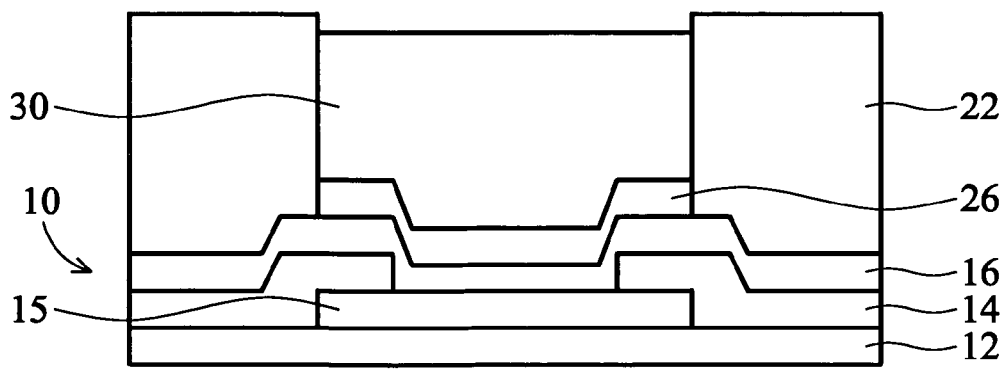
Figure 1D:
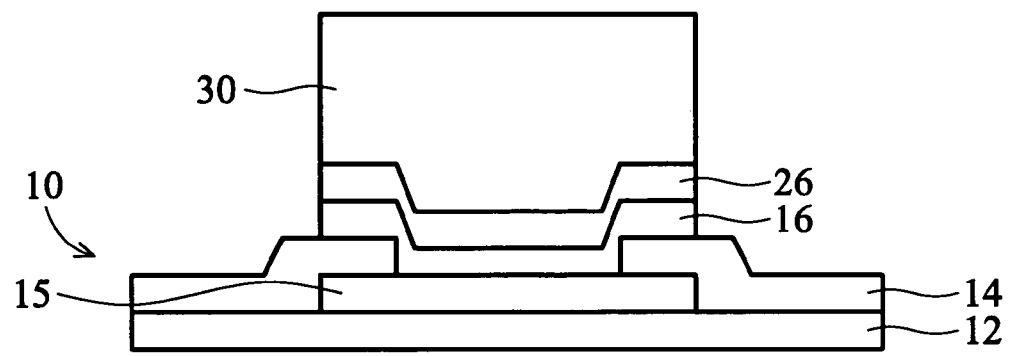
Figure 1E:
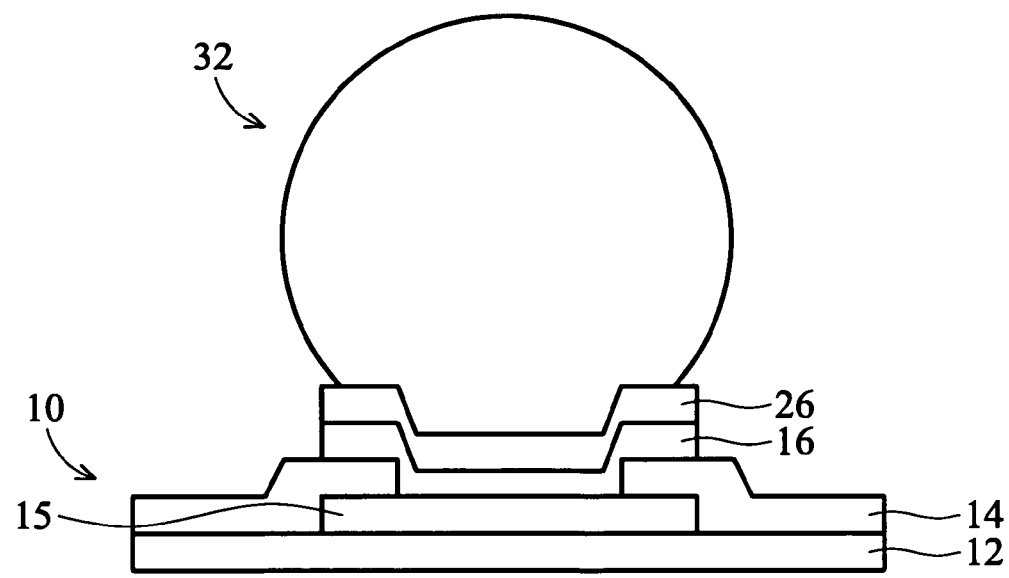
Figure 2A:
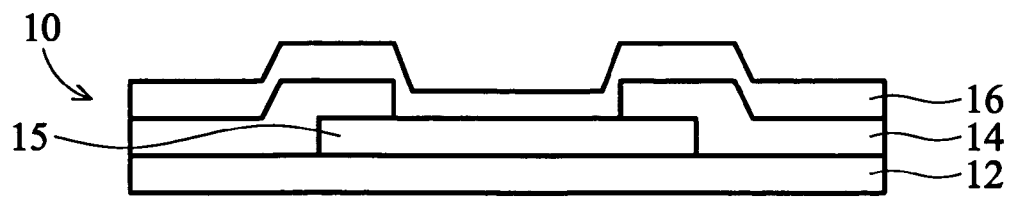
FIGS. 2A–2G are cross-sectional views of a semiconductor device depicting a method of forming a robust solder bump structure according to one embodiment of the present invention.

As shown in FIG. 2A, a cross-sectional view of a semiconductor device depicting a method of forming a solder bump structure according to one embodiment of the present invention is provided. A semiconductor wafer 10 is provided having a base semiconductor substrate 12 with metal interconnect layers (not shown) overlying substrate 12 and a passivation layer 14, which may be one or more layers, that extends over a contact pad 15 located on the upper surface of the semiconductor wafer 10. Substrate 12 is understood to include active and passive devices, conductive layers and dielectric layers and the type of the substrate is a design choice dependent on the fabrication process being employed. Following patterning and development by conventional photolithographic processes, passivation layer 14 has an opening therein exposing a portion of contact pad 15. Passivation layer 14 may be comprised of a material such as for example, undoped silicate glass (USG), silicon nitride (SiN), silicon dioxide ($SiO_2$), and silicon oxynitride (SiON) and may have a thickness of from about 5,000 Angstroms to about 15,000 Angstroms. Passivation layer 14 may be deposited by chemical vapor deposition (CVD) techniques. Contact pad 15 establishes electrical contact between the electrical interconnects in semiconductor substrate 12 and a later to be formed overlying solder bump. Contact pad 15 may be made from any of a variety of metals, including, for example, aluminum, aluminum alloys, copper, and copper alloys.

An under bump metallurgy (UBM) layer 16 is then formed over the entire upper surface of semiconductor wafer 10 including passivation layer 14 and the upper surface of contact pad 15 to provide protection for the integrated circuits while making good mechanical and electrical contact with a to be formed solder bump. UBM layer 16 may comprise of one or more layers and a variety of different metals, such as titanium (Ti), copper (Cu), and nickel (Ni), for example. UBM layer 16 may have a thickness of from about 0.5 microns to about 8 microns and may be deposited by any of a variety of methods including evaporation and electroplating. In one embodiment, UBM layer 16 comprises an adhesion layer, a wetting layer formed above the adhesion layer, and a protection layer formed above the wetting layer. The adhesion layer functions to adhere to contact pad 15 and the surrounding passivation layer 14 while providing strong, low-stress mechanical and electrical connection. The wetting layer provides a wettable surface for the molten solder during the solder bumping process and provides good bonding of the solder to the underlying metal. Finally, the protection layer may be provided to add reliable protection to the underlying layers.

Figure 2B:
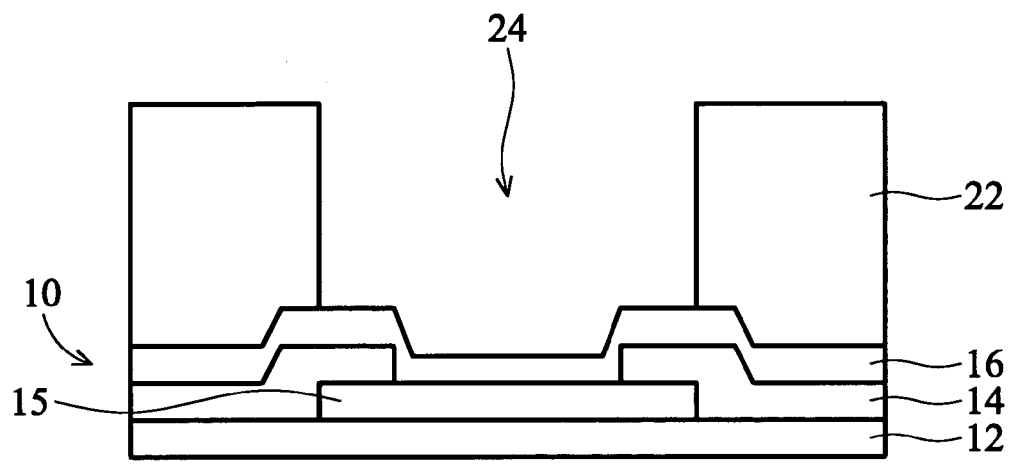

FIG. 2B shows a cross-sectional view of the structure of FIG. 2A showing a photoresist layer 22 formed and then patterned on UBM layer 16 according to one embodiment of the present invention. Photoresist layer 22 may comprise of liquid photoresists which typically form mushroom shaped bumps or dry film resists (DFR) which form larger column shaped bumps. However, one skilled in the art will understand that any type of photoresist material may be used in the present invention without departing from the spirit and scope of the invention. Photoresist layer 22 may be applied on UBM layer 16 by conventional deposition processes such as spin coating to obtain a height of about 100 µm. In one embodiment, photoresist layer 22 has a height of from about 100 µm to about 150 µm high. Following deposition, photoresist layer 22 thereafter undergoes a conventional patterning process to form an opening 24 therein. In one embodiment, photoresist layer 22 is patterned with standard UBM sized opening to accommodate standard solder volume. As is understood by those skilled in the art, prior to the patterning and developing steps, photoresist layer 22 may optionally be cured or baked to further harden the surface of the layer of photoresist.

Figure 2C:
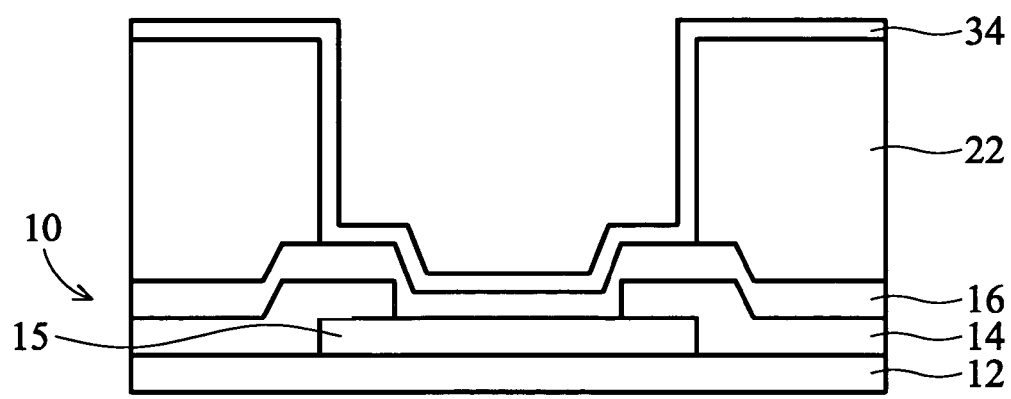
Figure 2D:
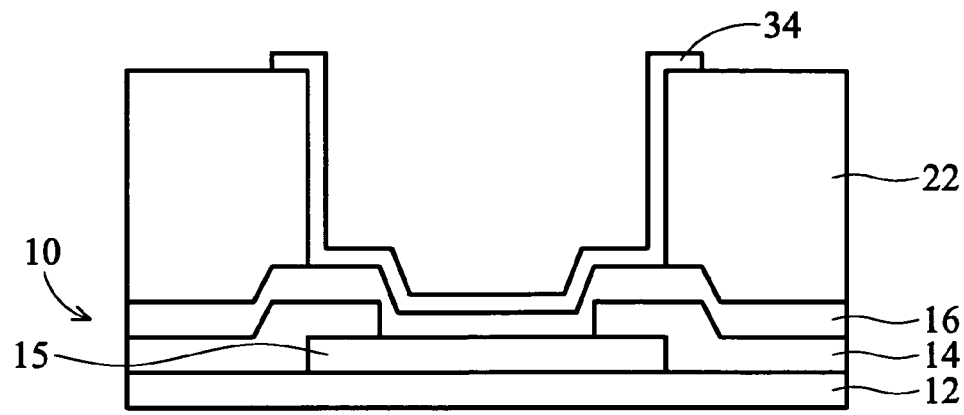

FIG. 2C shows a cross-sectional view of the structure of FIG. 2B showing a sidewall bump layer 34 formed over the exposed surfaces of the patterned photoresist layer 22 and the UBM layer 16. The sidewall bump layer 34 serves to reduce the solder bump diameter, maintain the solder bump height, and reduce the sharp angle between the solder bump and the underlying UBM layers, as is evidenced in conventional solder bump manufacturing, thereby increasing solder bump joint integrity and reliability. In one embodiment, the sidewall bump layer 34 includes but is not limited to a nickel layer and a copper layer and the sidewall bump layer 34 has a thickness of from about 10,000 Angstroms to about 80,000 Angstroms and is formed by conventional deposition processes such as, for example sputtering and plating. Following deposition of sidewall bump layer 34, as shown in FIG. 2D, the sidewall bump layer 34 is patterned and a portion of the sidewall bump layer 34 on the photoresist layer 22 is etched away by conventional photolithographic procedures.

Figure 2E:
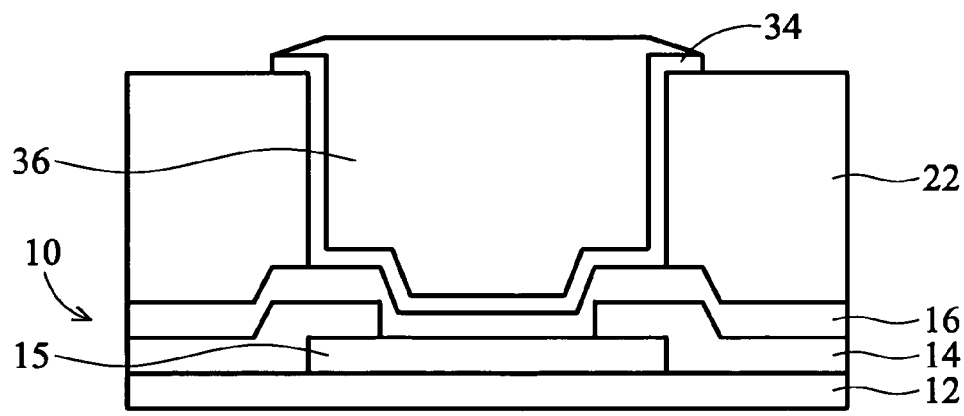

With reference to FIG. 2E, an electrically conductive material (solder material) may be deposited in the opening 24 bordered by the etched sidewall bump layer 34 to form a solder column 36. The electrically conductive material may be any of a variety of metals, metal alloys or metals and mixtures of other materials, but preferably, the electrically conductive material is a solder. The solder may be any of a variety of compositions and in one embodiment, the solder is in a 63 weight percent Sn, 37 weight percent Pb composition.

Figure 2F:
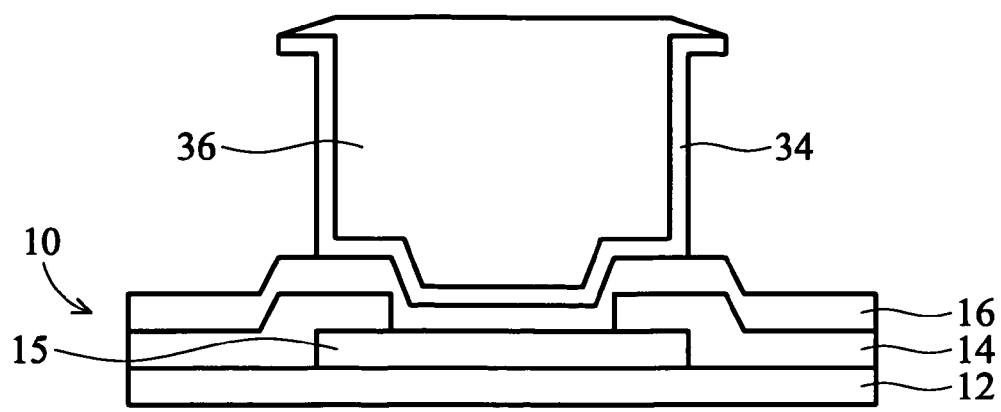
Figure 2G:
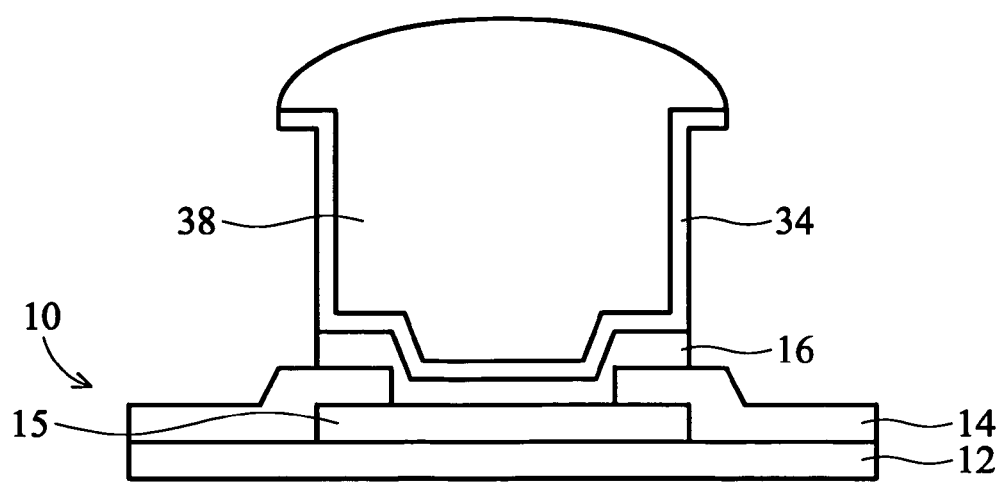

As shown in FIG. 2F, after removal of photoresist layer 22, the UBM layer 16 is etched through by reactive ion etch (RIE) process, for example, to the underlying passivation layer 14 using the solder column 36 as an etching mask. The solder column 36 is then reflown by heating to form a solder bump 38 on the semiconductor wafer 10, as depicted in FIG. 2G.

It is understood that in comparison to spherical-shaped solder bumps formed by conventional methods, the present invention teaches formation of solder bumps having reduced solder bump diameter, maintained solder bump height and a reduced sharp angle between the solder bump and the underlying UBM layers. In the present invention, by increasing the height of the solder joints, the strain observed at the solder joints can be reduced and consequently the fatigue reliability of the solder joints in flip chip bonding application can be improved. Furthermore, the pitch of the solder bump arrays can be reduced in order to accommodate higher level of circuit integration in integrated circuit devices that require greater interconnection densities.

In the preceding detailed description, the present invention is described with reference to specifically exemplary embodiments thereof. It will, however, be evident that various modifications, processes, structures, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for forming a solder bump, comprising:
   providing a substrate having at least one contact pad formed thereon;
   forming a passivation layer overlying the substrate, the passivation layer having at least one opening therein exposing a portion of the contact pad;
   forming a UBM (Under Bump Metallurgy) layer overlying the passivation layer and the contact pad;
   providing a patterned and etched light sensitive layer overlying the UBM layer, the light sensitive layer defining at least one opening therein; and
   forming a sidewall bump layer over the exposed surfaces of the light sensitive layer and the UBM layer.

2. The method of claim 1, further comprising removing a portion of the sidewall bump layer above the light sensitive layer.

3. The method of claim 2, further comprising depositing a solder material in the opening bordered by the etched sidewall bump layer to form a solder column.

4. The method of claim 3, further comprising removing the light sensitive layer and etching a portion of the UBM layer by using the solder column defined by the sidewall bump layer as an etching mask.

5. The method of claim 4, further comprising reflowing the solder column to create a solder bump.

6. The method of claim 1, wherein the passivation layer is a material selected from the group consisting of undoped silicate glass (USG), silicon nitride (SiN), silicon dioxide ($SiO_2$), and silicon oxynitride (SiON) and has a thickness of from about 5,000 Angstroms to about 15,000 Angstroms.

7. The method of claim 1, wherein forming the UBM layer comprises forming a plurality of conductive layers having a thickness of from about 0.5 microns to about 8 microns.

8. The method of claim 7, wherein forming the conductive layers comprises:
   forming an adhesion layer;
   forming a wetting layer above the adhesion layer; and
   forming a protection layer above the wetting layer.

9. The method of claim 1, wherein the UBM layer is selected from the group consisting of titanium, copper, and nickel.

10. The method of claim 1, wherein the light sensitive layer has a height of from about 100 μm to about 150 μm high.

11. The method of claim 1, wherein the sidewall bump layer comprises a nickel layer and a copper layer and the sidewall bump layer has a thickness of from about 10,000 Angstroms to about 80,000 Angstroms.

12. A method for forming a solder bump, comprising:
   providing a substrate having at least one contact pad formed thereon;
   forming a passivation layer overlying the substrate, the passivation layer having at least one opening therein exposing a portion of the contact pad;
   forming a UBM (Under Bump Metallurgy) layer overlying the passivation layer and the contact pad;
   providing a patterned and etched light sensitive layer overlying the UBM layer, the light sensitive layer defining at least one opening therein;
   forming a sidewall bump layer over the exposed surfaces of the light sensitive layer and the UBM layer;
   removing a portion of the sidewall bump layer above the light sensitive layer;
   depositing a solder material in the opening bordered by the etched sidewall bump layer to form a solder column; and
   reflowing the solder column to create a solder bump.

13. The method of claim 12, further comprising removing the light sensitive layer and etching a portion of the UBM layer by using the solder column defined by the sidewall bump layer as an etching mask.

14. The method of claim 12, wherein the sidewall bump layer comprises a nickel layer and a copper layer and the sidewall bump layer has a thickness of from about 10,000 Angstroms to about 80,000 Angstroms.

15. A bump structure on a semiconductor device made by the method of claim 5.

* * * * *